(12) United States Patent
Yamamoto

(10) Patent No.: US 7,876,190 B2
(45) Date of Patent: Jan. 25, 2011

(54) DOUBLE-TUNED CIRCUIT

(75) Inventor: Masaki Yamamoto, Miyagi-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 0 days.

(21) Appl. No.: 12/484,575

(22) Filed: Jun. 15, 2009

(65) Prior Publication Data
US 2010/0001825 A1 Jan. 7, 2010

(30) Foreign Application Priority Data
Jul. 2, 2008 (JP) .............................. 2008-173434

(51) Int. Cl.
*H01F 5/00* (2006.01)
(52) U.S. Cl. ..................... 336/200; 336/223; 336/232
(58) Field of Classification Search .................. 336/200, 336/223, 232
See application file for complete search history.

(56) References Cited

U.S. PATENT DOCUMENTS 7,710,232 B1 * 5/2010 Stalford et al. .............. 336/192

2003/0034868 A1 * 2/2003 Osada ......................... 336/200
2009/0289871 A1 * 11/2009 Lin et al. ...................... 343/860

FOREIGN PATENT DOCUMENTS

| JP | 08-070236 | | 3/1996 |
| JP | 2001076936 A | * | 3/2001 |
| JP | 2003-110408 | | 4/2003 |

* cited by examiner

*Primary Examiner*—Anh T Mai
(74) *Attorney, Agent, or Firm*—Brinks Hofer Gilson & Lione (57) ABSTRACT

A double-tuned circuit includes a primary side tuned circuit having a first air-cored coil and a secondary side tuned circuit having a second air-cored coil. The first air-cored coil and the second air-cored coil are opposed to each other so that one opening end of the first air-cored coil and one opening end of the second air-cored coil are capable of being coupled to each other on a coil mounting surface. The coil mounting surface is provided with a first conductive pattern formed adjacent to the first air-cored coil in a direction perpendicular to an arrangement direction of the first and second air-cored coils, and both ends of first conductive pattern are connected to a ground.

5 Claims, 10 Drawing Sheets

| RECEPTION FREQUENCY (MHz) | ① BANDWIDTH (MHz) | ② GAIN (dB) ANT ⇒ IF out | ③ RF SELECTIVITY (Image: dB) |
|---|---|---|---|
| 861 | 21.3 | 41.8 | 66.05 |
| 801 | 24.1 | 42.0 | |
| 705 | 25.1 | 42.0 | |
| 603 | 23.6 | 41.0 | 68.15 |
| 501 | 20.7 | 40.3 | |
| 405 | 18.9 | 41.7 | |
| 369 | 18.2 | 42.9 | 65.66 |

| Des (MHz) | COUNTER-MEASURE | ① BAND WIDTH (MHz) | ② GAIN (dB) ANT ⇨ |
|---|---|---|---|
| 861 | (1) | 19.3 | 26.5 |
| 861 | (2) | 20.1 | 26.5 |
| 861 | (3) | 20.5 | 26.5 |
| 801 | (3) | 22.3 | 26.0 |
| 705 | (3) | 24.4 | 25.3 |
| 603 | (3) | 24.1 | 24.3 |
| 501 | (3) | 22.0 | 24.4 |
| 405 | (3) | 18.4 | 25.7 |
| 369 | (3) | 18.5 | 26.0 |

① : INITIAL STATE
② : ADDING PATTERN 15
③ : ADDING PATTERN 15 + PATTERN 14

DOUBLE-TUNED CIRCUIT

CROSS REFERENCE TO RELATED APPLICATIONS

The present application contains subject matter related to and claims priority to Japanese Patent Application No. 2008-173434 filed in the Japanese Patent Office on Jul. 2, 2008, the entire contents of which being incorporated herein by reference.

BACKGROUND

1. Technical Field

The present invention relates to a double-tuned circuit used for a tuner such as a television receiver.

2. Related Art

Figure 9:
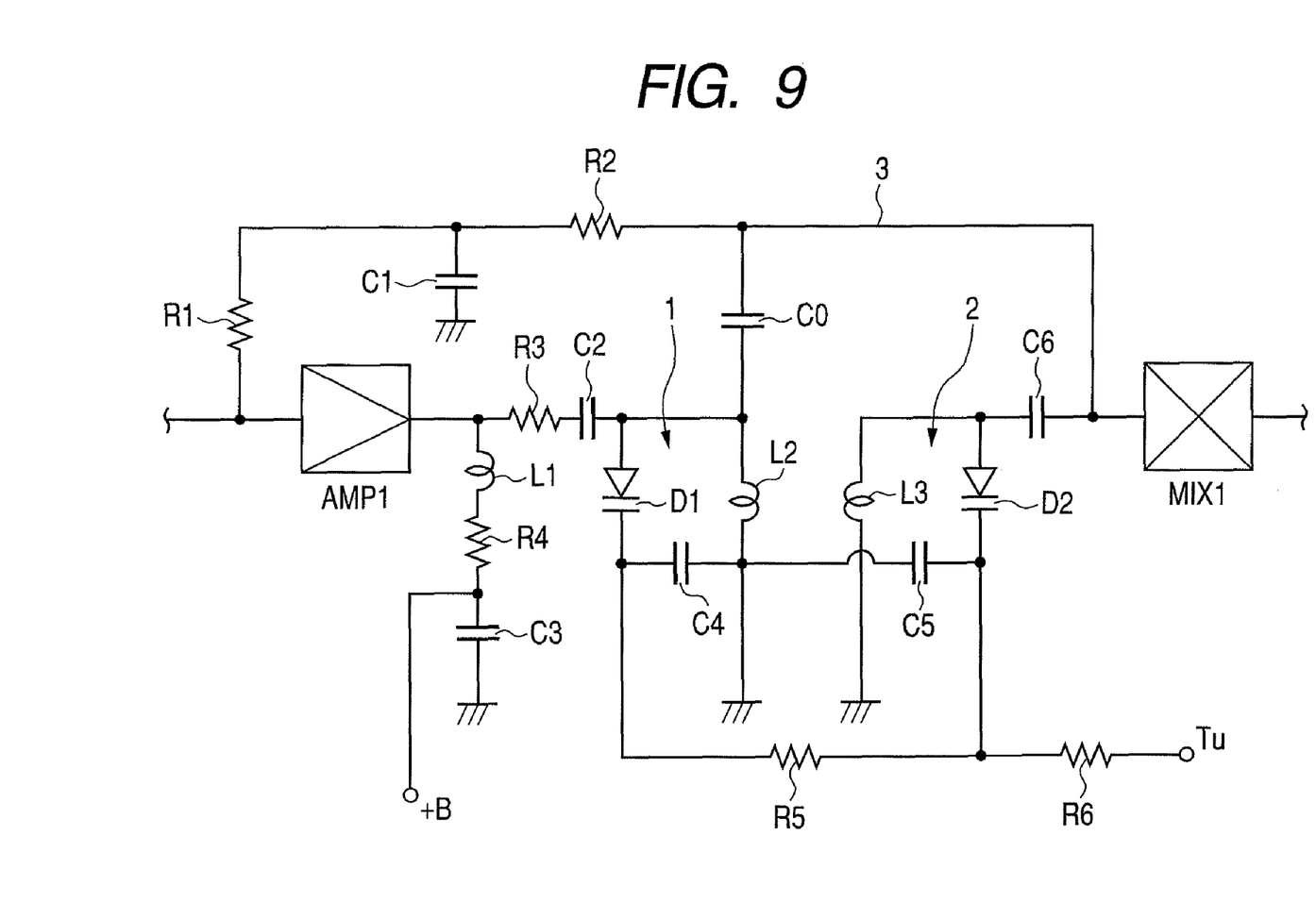
FIG. 9 is a circuit diagram illustrating an RF double-tuned circuit having an image trap formed therein.

There is known a double-tuned circuit of a television tuner in which a trap circuit for attenuating an image signal is formed. FIG. 9 is a circuit diagram illustrating an RF double-tuned circuit having an image trap formed therein. A television reception signal is input to a high frequency amplifier AMP1 through an antenna tuned circuit (not shown), and an output of the high frequency amplifier AMP1 is input to a primary side tuned circuit 1 of the RF double-turned circuit. A secondary side tuned circuit 2 is coupled to the primary side tuned circuit 1, a reception signal taken from the RF double-tuned circuit including the primary side tuned circuit 1 and the secondary side tuned circuit 2 is frequency-converted in a mixer circuit MIX1, and the converted signal is output to a decoding circuit (not shown)

A series circuit including an inductor L1 and a resistor R4 is connected between an output terminal of the high frequency amplifier AMP1 and a ground. One end of a resistor R3 is connected to a connection point between the output terminal of the high frequency amplifier AMP1 and the inductor L1, and the input terminal of the primary side tuned circuit 1 is connected to the other end of the resistor R3 through a capacitor C2. The ground side of the resistor R4 is connected to a direct-current blocking capacitor C3, and a direct-current voltage +B applied to a connection point between the capacitor C3 and the resistor R4 is applied to the high frequency amplifier AMP1.

In the primary side tuned circuit 1, a parallel connection circuit including a varactor diode D1 and a tuning coil L2 is connected between the input end of the primary side tuned circuit 1 and the ground. A cathode of the varactor diode D1 is connected to the ground through a capacitor C4. In the secondary side tuned circuit 2, a parallel connection circuit including a varactor diode D2 and a tuning coil L3 is connected between the output end of the secondary side tuned circuit 2 and the ground. A cathode of the varactor diode D2 is connected to the ground through a capacitor C5. A tuning voltage Tu is applied to the cathode of the varactor diode D1 of the primary side tuned circuit 1 through a resistor R5, and is applied to the cathode of the varactor diode D2 of the secondary side tuned circuit 2 through a resistor R6. The tuning frequency from the outside can be varied by controlling the tuning voltage Tu.

The output end of the secondary side tuned circuit 2 is connected to an input terminal of the mixer circuit MIX1 through a capacitor C6. A conductive line 3 extends from the output end side of the secondary side tuned circuit 2 to the primary side tuned circuit 1 side and a trap for attenuating an image signal frequency is formed in a very small capacitor Co formed between the conductive line 3 and a hot side of the tuning coil L2 of the primary side tuned circuit 1. The end of the conductive line 3 is connected to the input end of the high frequency amplifier AMP1 through the resistor R1. A connection point between the resistors R1 and R2 interpolated in the way of the conductive line 3 is connected to the ground through the capacitor C1.

Figure 10:
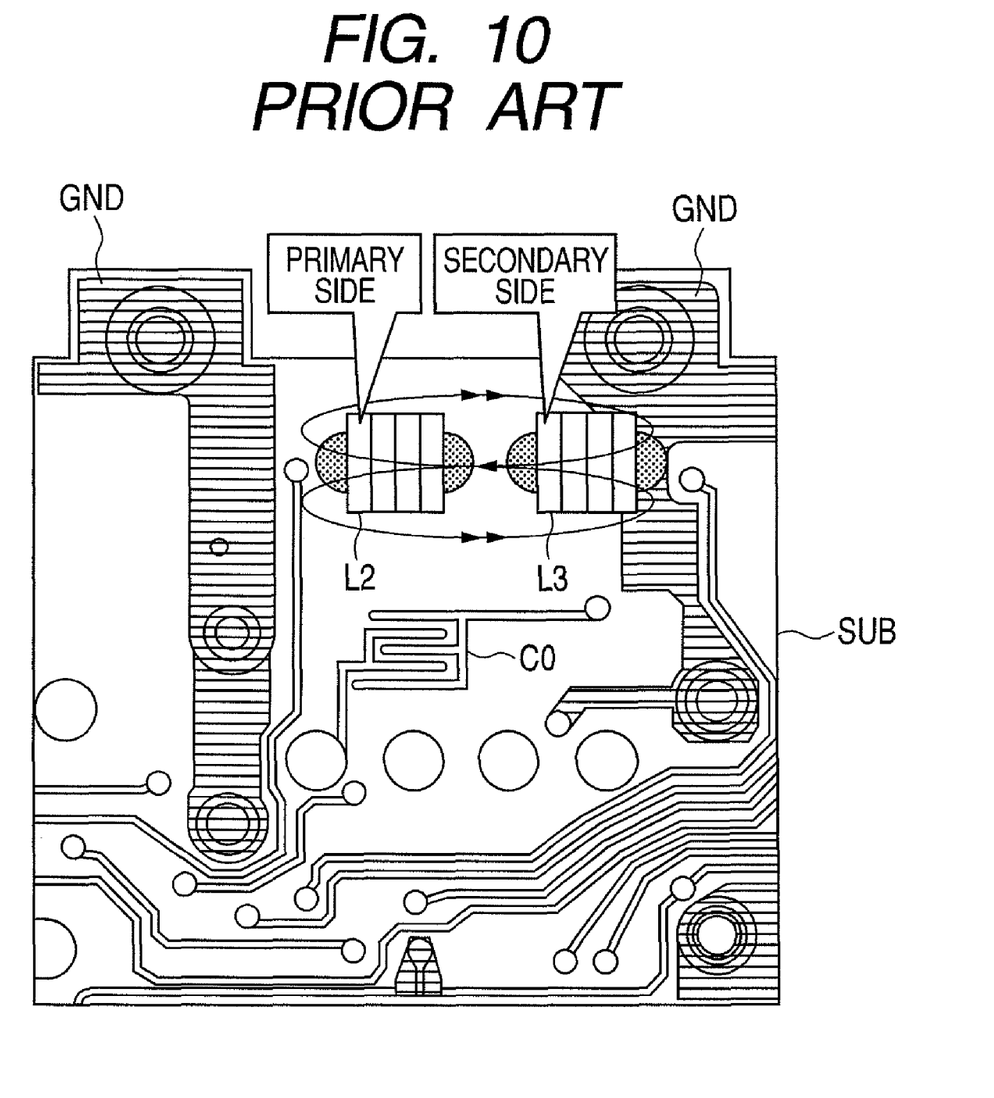
FIG. 10 is a diagram illustrating the disposition of a coil mounting surface of the known RF double-tuned circuit.

FIG. 10 is a diagram illustrating the disposition of a coil mounting surface of the known RF double-tuned circuit. Air-cored coils formed in an air-cored shape are used as tuning coils L2 and L3 of primary side and secondary side tuned circuits 1 and 2. A pair of coil inserting holes are provided on a circuit substrate SUB at a predetermined interval, and the tuning coils L2 and L3 are inserted into and fixed to the coil inserting holes, thereby mounting the tuning coil L3 of the secondary side tuned circuit 2 formed in the air-cored shape to be concentric with the tuning coil L2 of the primary side tuned circuit 1 formed in the air-cored shape.

The tuning coils L2 and L3 are mounted and fixed onto the circuit substrate SUB, an adjusting worker directly inserts an adjusting rod or the like into the tuning coils L2 and L3 of the primary side and secondary side tuned circuits 1 and 2 and moves the adjusting rod or the like to widen or narrow the tuning coils L2 and L3, and the adjusting worker changes and adjusts the inductance values of the tuning coils L2 and L3 so as to take the inductive coupling necessary between the tuning coils L2 and L3 of the primary side and secondary side tuned circuits 1 and 2 and to obtain the desired tuning frequency of the primary side and secondary side tuned circuits 1 and 2. Two adjustments of taking the inductive coupling and adjusting the tuning frequency of each of the tuning circuits 1 and 2 are performed together by the tuning coils L2 and L3 of the primary side and secondary side tuned circuits 1 and 2.

An example of the related art is described in Japanese Patent Application Laid-Open No. 8-70236.

In a double-tuned circuit for tuning to a relatively high frequency such as a UHF band, the inductances of tuning coils L2 and L3 of primary side and secondary side tuned circuits 1 and 2 become small. Accordingly, to take the necessary inductive coupling, the tuning coils L2 and L3 of the primary side and secondary side tuned circuits 1 and 2 have to get very close.

However, it is difficult to make both coils close enough to obtain sufficient coupling due to the restriction of the coil inserting holes on the substrate. For this reason, it is necessary to adjust the tuning coils L2 and L3 fixed to the coil inserting holes so as to bring them closer, work efficiency is low, and there is a productivity problem.

In addition, such a double-tuned circuit has an influence on the frequency precision of an image trap formed in the tuned circuit, and thus it is difficult to obtain a uniform disturbance blocking characteristic within a reception band.

SUMMARY

According to a first aspect of the disclosure, there is provided a double-tuned circuit including: a primary side tuned circuit having a first air-cored coil; and a secondary side tuned circuit having a second air-cored coil, wherein the first air-cored coil and the second air-cored coil are opposed to each other so that one opening end of the first air-cored coil and one opening end of the second air-cored coil are capable of being coupled to each other on a coil mounting surface, and wherein the coil mounting surface is provided with a first conductive pattern formed adjacent to the first air-cored coil in a direction perpendicular to an arrangement direction of the first and second air-cored coils, and both ends of first conductive pattern are connected to a ground.

With such a configuration, high frequency current flows in the first conductive pattern formed parallel to the first air-cored coil. Accordingly, the coupling degree between the first and second air-cored coils is increased, and coil interval adjusting work to secure the coupling degree is unnecessary. In addition, it is possible to optimize the coupling degree and to improve the frequency precision of an image trap by adjusting the pattern width of the first conductive pattern, and thus it is possible to make selectivity uniform among channels throughout a wide band.

DESCRIPTION OF EXEMPLARY EMBODIMENTS

Hereinafter, preferred embodiments of the disclosure will be described in detail with reference to the accompanying drawings.

Figure 1:
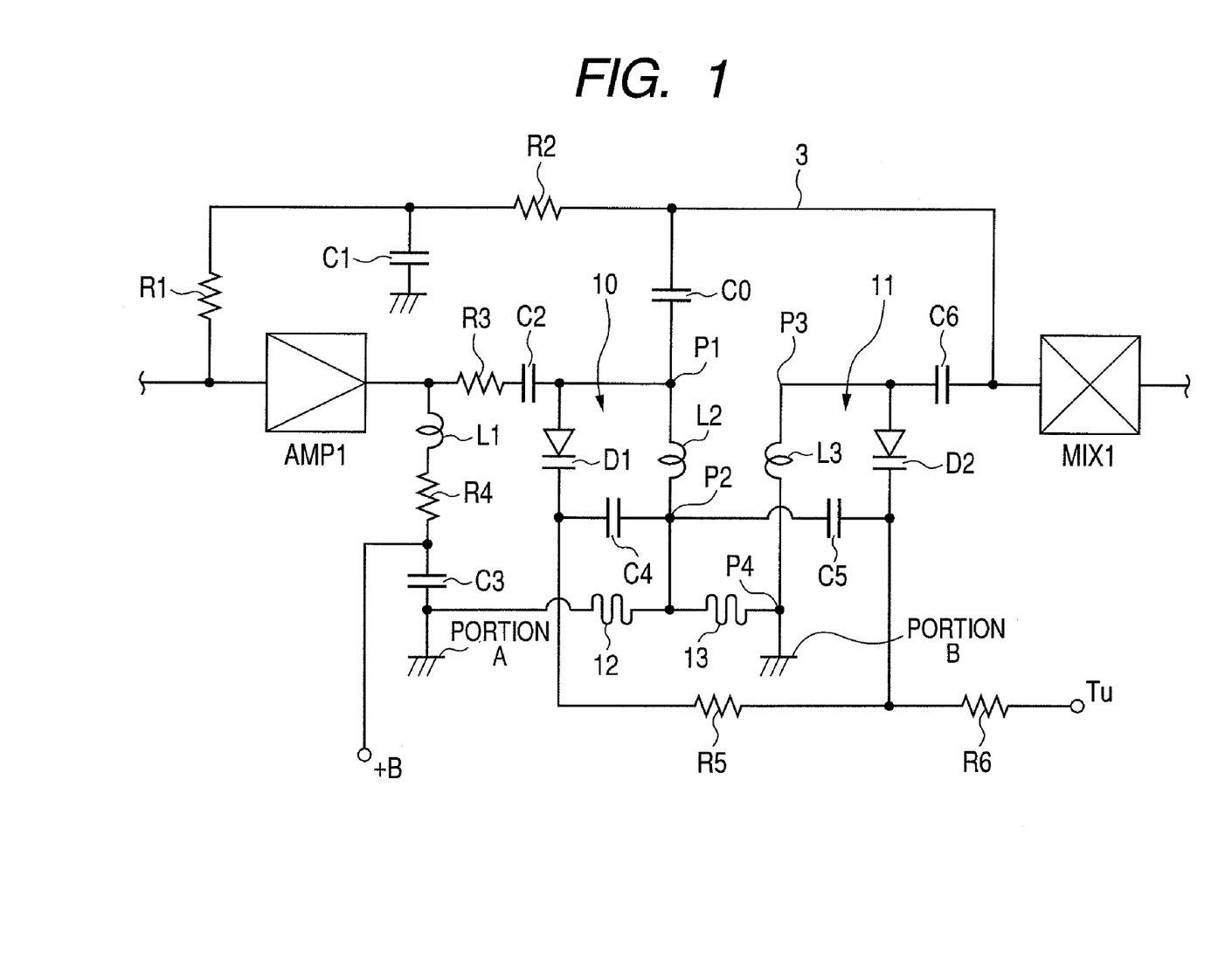
FIG. 1 is a diagram illustrating a double-tuned circuit according to an embodiment.

FIG. 1 is a diagram illustrating a double-tuned circuit of a television tuner according to an embodiment. The same reference numerals and signs are given to the same elements as those of the double-tuned circuit shown in FIG. 9, and overlapping description is avoided.

The double-tuned circuit of the television tuner according to the embodiment includes a primary side tuned circuit 10 and a secondary side tuned circuit 11, and one opening end of a tuning coil L2 as a first air-cored coil and one opening end of a tuning coil L3 as a second air-cored coil which are opposed and capable of being coupled to each other. A copper foil pattern 12 as a first conductive pattern is formed parallel to the tuning coil L2 of the primary side tuned circuit 10 on one side of the tuning coil L2, and a copper foil pattern 13 as a second conductive pattern is formed parallel to the tuning coil L3 of the secondary side tuned circuit 11 on the other side of the tuning coil L3. The copper foil pattern 13 connects a ground end of the tuning coil L2 of the primary side tuned circuit 10 to a ground end of the tuning coil L3 of the secondary side tuned circuit 11. The other circuit configuration is the same as that of the double-tuned circuit shown in FIG. 9.

Figure 2A:
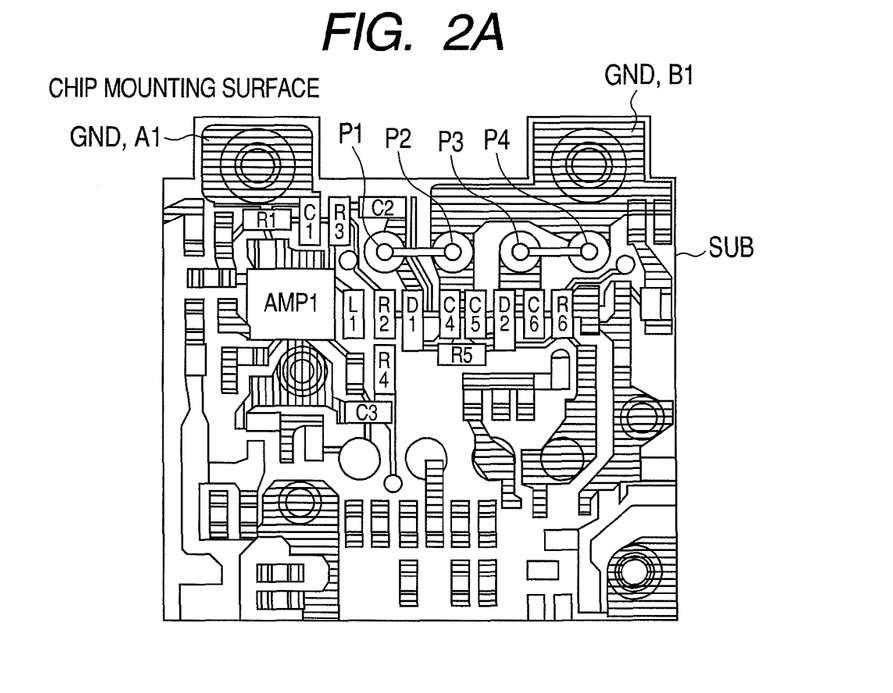
FIG. 2A is a plan view illustrating a chip mounting surface of the double-tuned circuit according to the embodiment.
Figure 2B:
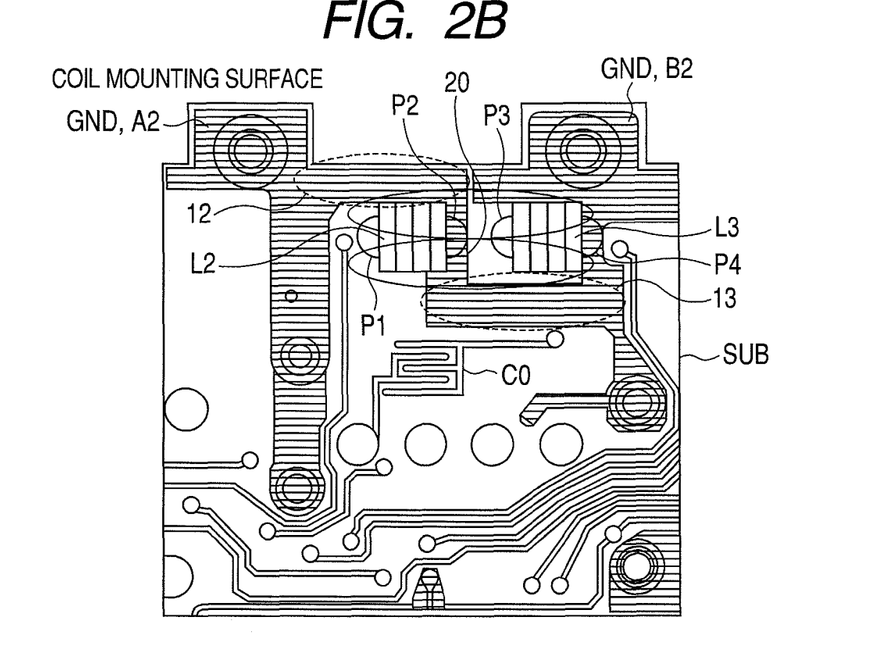
FIG. 2B is a plan view illustrating a coil mounting surface of the double-tuned circuit.
Figure 3:
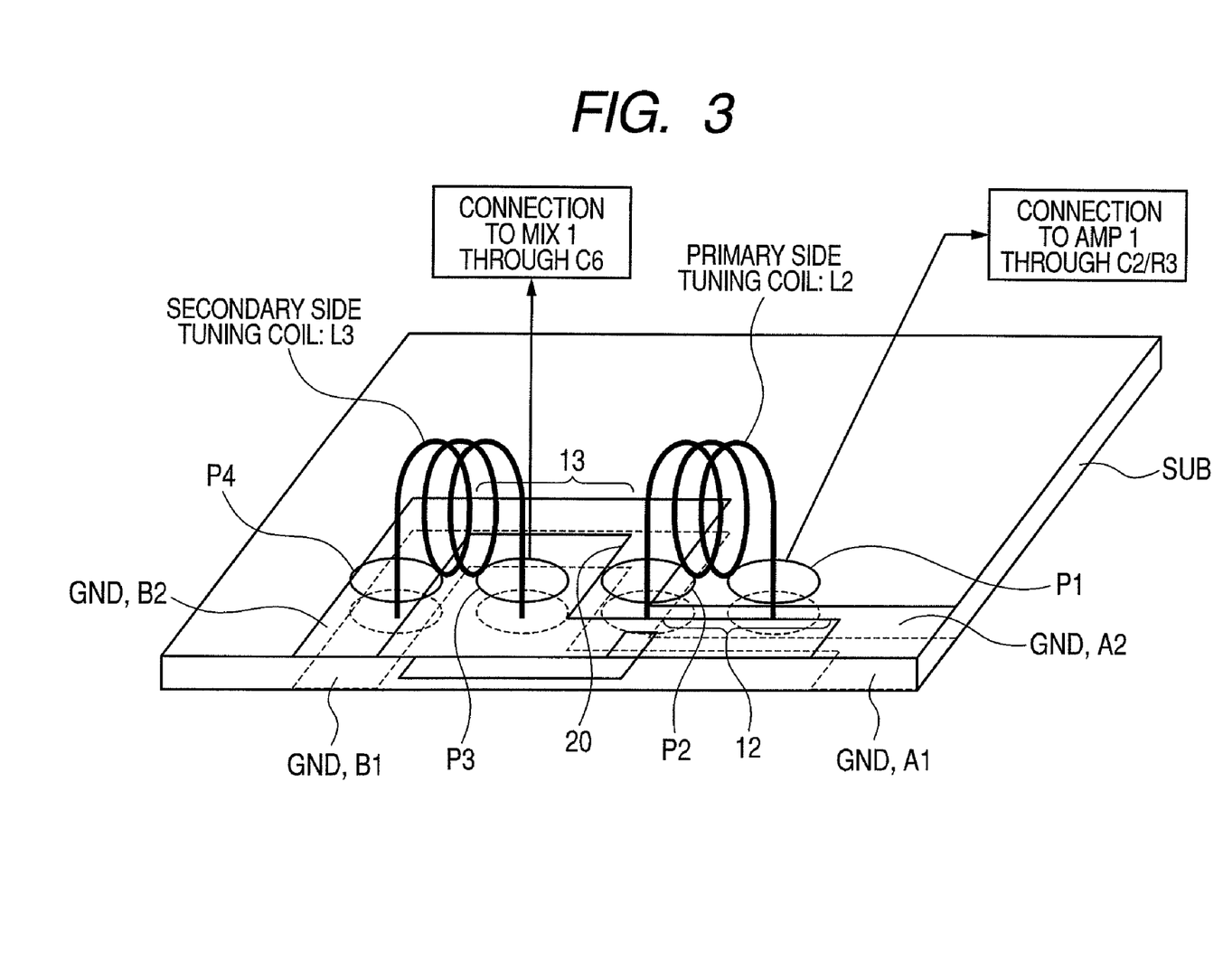
FIG. 3 is a schematic and perspective view illustrating the coil mounting surface shown in FIG. 2B.

FIG. 2A is a plan view illustrating a chip mounting surface of the double-tuned circuit according to the embodiment, and FIG. 2B is a plan view illustrating a coil mounting surface of the double-tuned circuit. FIG. 3 is a schematic and perspective view illustrating the coil mounting surface shown in FIG. 2B.

A point P1 shown in FIG. 2A is connected to a hot side of the primary side tuning coil L2 on the coil mounting surface, and a point P2 is connected to a cold side of the primary side tuning coil L2. A point P3 is connected to a hot side of the secondary tuning coil L3 on the coil mounting surface, and a point P4 is connected to a cold side of the secondary side tuning coil L3. On the chip mounting surface shown in FIG. 2A, the hot side P1 of the primary side tuned circuit 10 is connected to an anode of a varactor diode D1 and an end of a capacitor C2 close to the tuned circuit. The cold side P2 of the primary side tuned circuit 10 is connected to a ground end of a capacitor C4 and a ground end of a capacitor C5. The hot side P3 of the secondary side tuned circuit 11 is connected to an anode of a varactor diode D2 and an end of a capacitor C6 close to the tuned circuit. The cold side P4 of the secondary side tuned circuit 11 is connected to a ground GND (B1).

As shown in FIG. 2B, a third conductive pattern 20 is formed on the coil mounting surface, and the third conductive pattern 20 is electrically connected to the ground end P2 of the tuning coil L2 and connects the end of the first copper foil pattern 12 to the end of the second copper foil pattern 13. In the embodiment, the first copper foil pattern 12 connecting the third conductive pattern 20 as the ground end P2 of the primary side tuning coil L2 to a first ground pattern, a ground GND (A2), is formed parallel to the primary side tuning coil L2 on the coil mounting surface. The second copper foil pattern 13 connecting the third conductive pattern 20 to a ground pattern GND (B2) as the ground end P4 of the secondary side tuning coil L3 is formed parallel to the secondary side tuning coil L3 on the opposite side to the first copper foil pattern 12 with the secondary side tuning coil L3 therebetween. The tuning coils L2 and L3 opposed to each other on the coil mounting surface are arranged along a magnetic flex direction as shown in FIG. 2B.

In the embodiment, the first copper foil pattern 12 is formed parallel to the primary side tuning coil L2 on the same surface, and the second copper foil pattern 13 is formed parallel to the secondary side tuning coil L3 on the same surface. Accordingly, the first and second copper foil patterns 12 and 13 serve as inductors in a high frequency band such as a UHF band, high frequency current is induced by electromagnetic coupling between the coils, the high frequency current is induced to the first and second copper foil patterns 12 and 13, and thus the entire coupling degree is increased.

In the invention, it is preferable that one or more conductive patterns are formed at positions where the coupling degree of the primary side and secondary side tuning coils L2 and L3 can be increased. As shown in FIG. 2B, in the viewpoint of increasing the coupling degree, it is most preferable that the conductive patterns are formed along a flowing direction of magnetic flux formed in the primary side and secondary side tuning coils L2 and L3 at the time of inductive coupling, but the effect of increasing the coupling degree can be expected even when they are not formed parallel. Even when the conductive patterns are formed on one side of the primary side or secondary side tuning coils L2 and L3, the effect of increasing the coupling degree can be expected.

In the above-described configuration, in a case where the coupling degree of the primary side tuning coil L2 and the secondary side tuning coil L3 is adjusted, it is possible to manage the situation by optimizing the pattern widths of the first and second copper foil patterns 12 and 13. For example, since frequency varies according to the product shipping area, the frequency is set to the desired frequency by adjusting the pattern width of the first copper foil pattern 12 or the second copper foil pattern 13, with the primary side and secondary side tuning coils L2 and L3 fixed to the circuit substrate SUB. Accordingly, it is possible to set an appropriate coupling degree, and to improve the frequency position precision of an image trap. As a result, a positional relationship between a reception frequency (desired wave) and an image trap frequency can be made uniform among a plurality of channels from a high frequency band to a low frequency band, and thus an attenuated amount of the image frequency can be substantially the same value.

Accordingly, even when there is a restriction on the close disposition of the primary side and secondary side tuning coils L2 and L3, it is possible to optimize the coupling degree by a simple adjustment of the first copper foil pattern 12 or the second copper foil pattern 13 without adjusting the interval between the coils. As a result, the frequency precision of an image trap is improved, and it is possible to obtain a uniform disturbance blocking characteristic in a reception band.

Figure 4A:
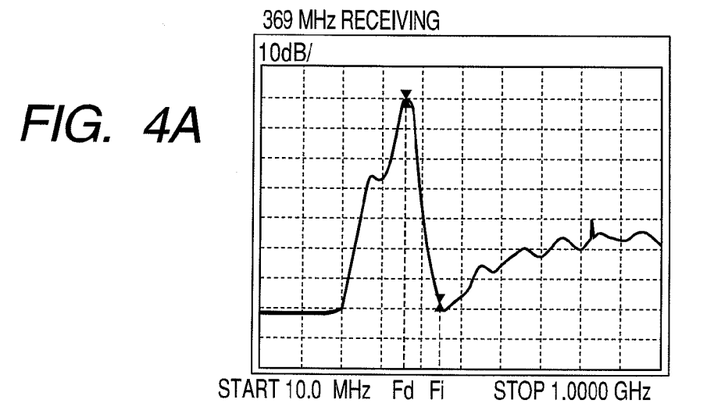
FIG. 4A, FIG. 4B, and FIG. 4C are diagrams illustrating the simulation results of a relationship between an image frequency and a reception signal (desired wave) using a double-tuned circuit tuned for North America.
Figure 4B:
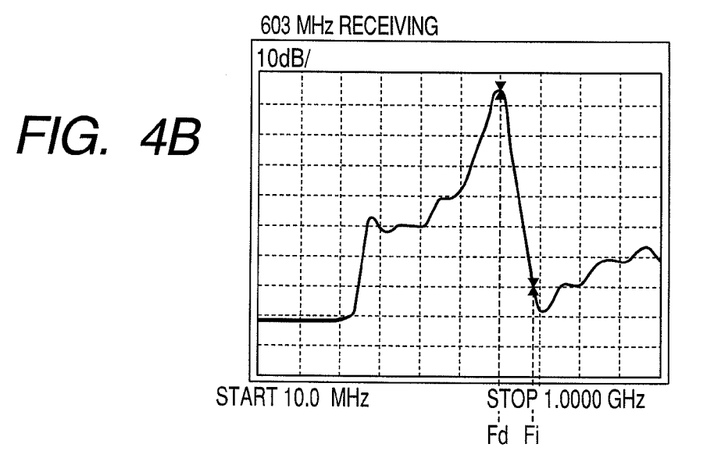
Figure 4C:
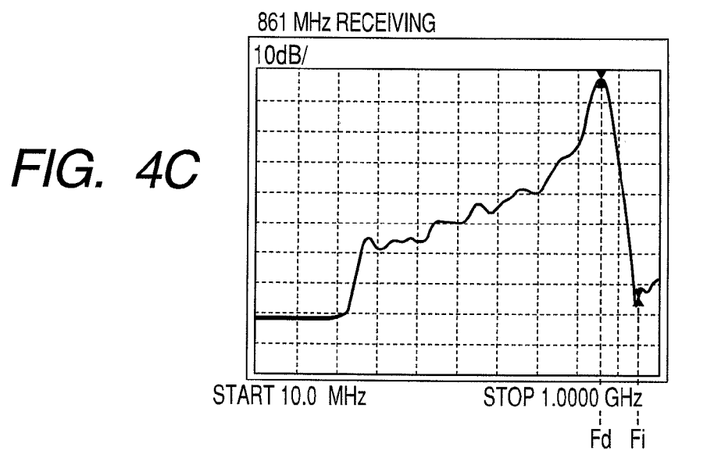

FIGS. 4A to 4C are diagrams illustrating the simulation results of a relationship between an image frequency and a reception signal (desired wave) in a case using a double-tuned circuit adjusted to the frequency for North America according to the embodiment. FIG. 4A shows a frequency selection characteristic at a reception frequency (369 MHz) in a low frequency band, FIG. 4B shows a frequency selection characteristic at a reception frequency (603 MHz) in a middle frequency band, and FIG. 4C shows a frequency selection characteristic at a reception frequency (861 MHz) in a high frequency band. An image frequency Fi is shown in a position away from a reception frequency Fd by 88 MHz on a high frequency band side. As shown in the simulation result, as for the reception frequency Fd in the wide band from the low frequency band to the high frequency band, an image trap is formed substantially at the same frequency as the image frequency Fi. In addition, an attenuated amount of the image trap is substantially the same throughout the whole band, and a positional relationship between the reception frequency and the image frequency is uniform in all bands from the low frequency band to the high frequency band. Moreover, it can be seen that an attenuated amount of the image frequency Fi can be substantially the same value.

Figure 5A:
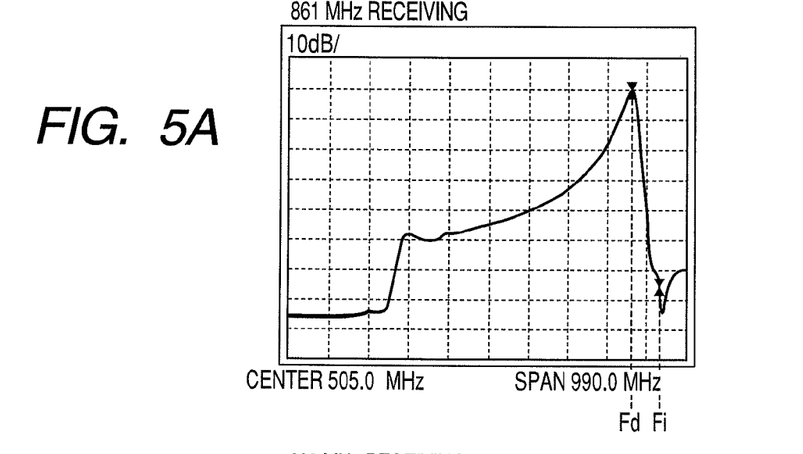
FIG. 5A, FIG. 5B, and FIG. 5C are diagrams illustrating the simulation results of a relationship between an image frequency and a reception signal (desired wave) using a double-tuned circuit tuned for Europe.
Figure 5B:
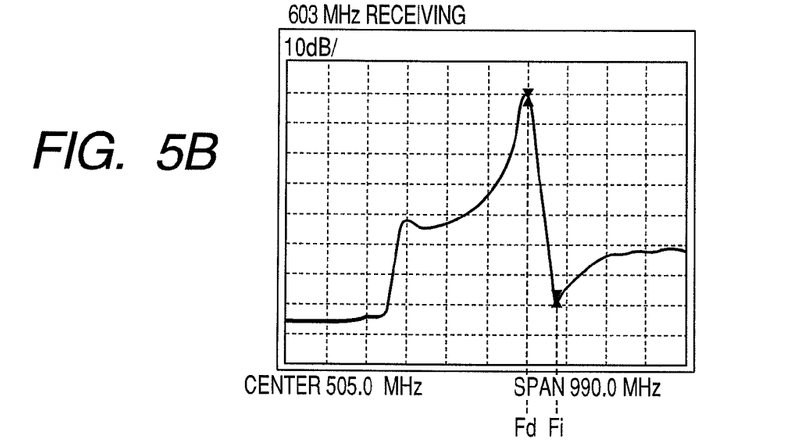
Figure 5C:
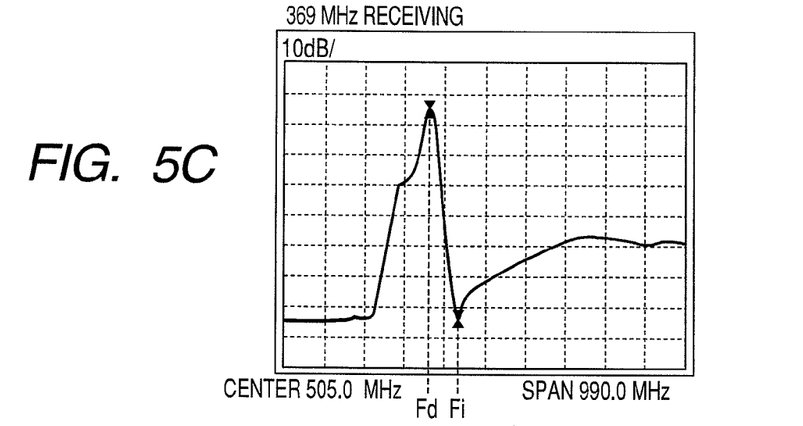

FIGS. 5A to 5C are diagrams illustrating the simulation results of a relationship between an image frequency and a reception frequency (desired wave) using a double-tuned circuit tuned for Europe. FIG. 5A shows a frequency selection characteristic at a reception frequency (861 MHz) in a high frequency band, FIG. 5B shows a frequency selection characteristic at a reception frequency (603 MHz) in a middle frequency band, and FIG. 5C shows a frequency selection characteristic at a reception frequency (369 MHz) in a low frequency band. An image frequency Fi is shown in a position away from a reception frequency Fd by 72.3 MHz on a high frequency band side. Similarly to the double-tuned circuit tuned for North America, a positional relationship between the reception frequency (desired wave) Fd and the image frequency Fi can be uniform from the high frequency band to the low frequency band, and thus it can be seen that an attenuated amount of the image frequency Fi can be substantially the same value.

Figure 6A:
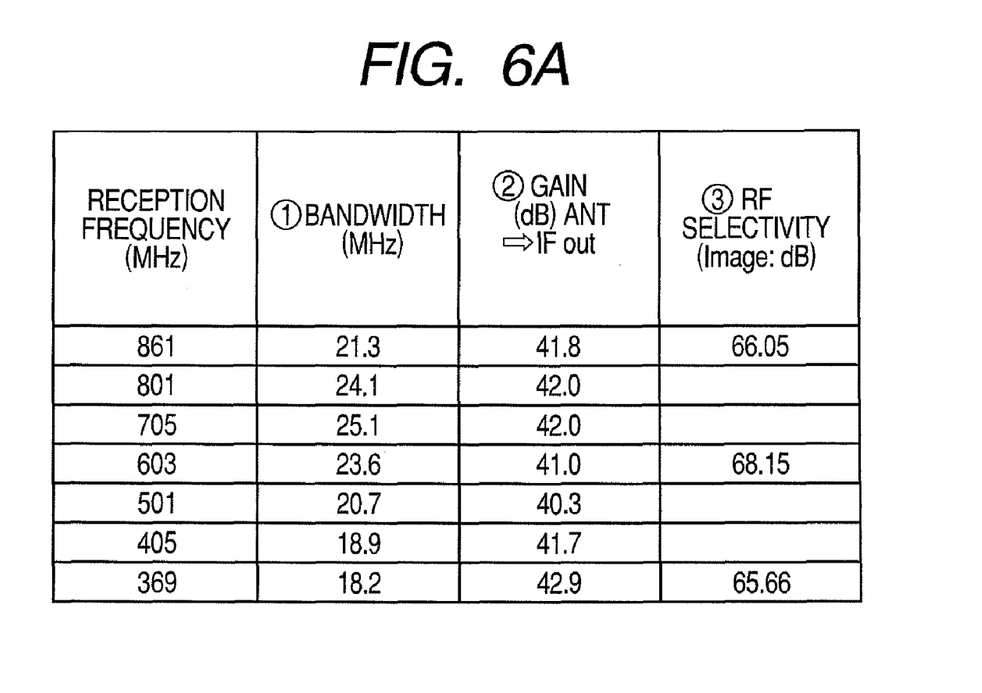
FIG. 6A is a diagram illustrating a performance test result of a double-tuned circuit from a bandwidth near a peak of a frequency selection characteristic.
Figure 6B:
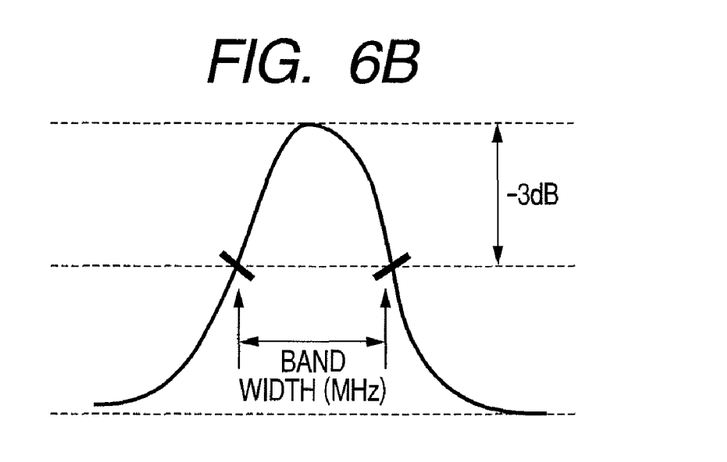
FIG. 6B is a diagram for explaining the method of bandwidth measurement.

FIG. 6A is a diagram illustrating a performance test result of a performance check of the double-tuned circuit from a bandwidth near a peak of the frequency selection characteristic. As shown in FIG. 6B, a bandwidth is measured at a position away from a peak point by −3 dB. As a result, uniform characteristics of around plus or minus 20 MHz can be seen throughout the whole band of 861 MHz to 369 MHz. In addition, uniform RF gain and frequency selectivity can be seen.

Figure 7:
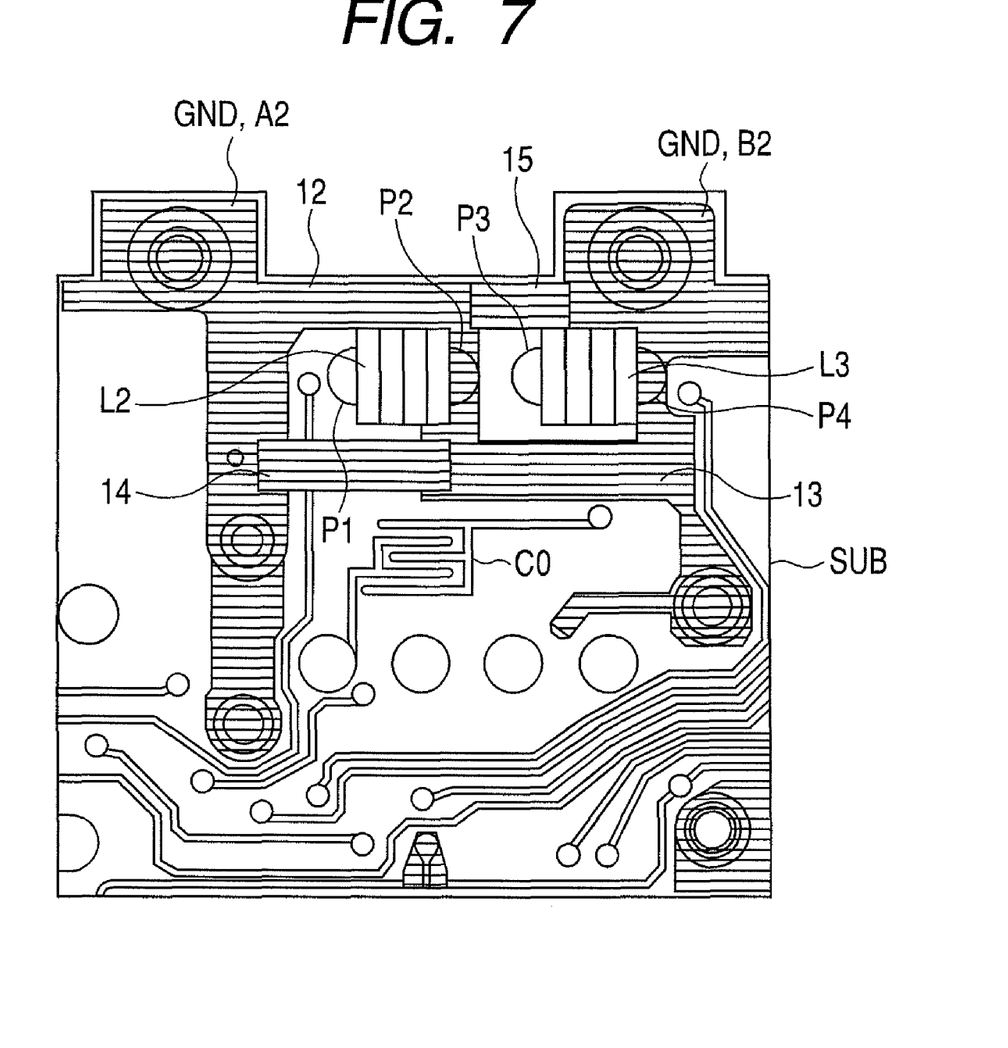
FIG. 7 is a plan view illustrating a coil mounting surface of a double-tuned circuit according to a modified example.

FIG. 7 is a plan view illustrating a coil mounting surface of a double-tuned circuit according a modified example of the embodiment. A chip mounting surface according to the modified example is the same as the chip mounting surface according to the embodiment shown in FIG. 2A. The same reference numerals and signs are given to the same elements as those of the coil mounting surface shown in FIG. 2B.

As shown in FIG. 7, a copper foil pattern 14 formed by extending the second copper foil pattern 13 is formed parallel on the opposite side of the copper foil pattern 12 with the primary side tuning coil L2 therebetween, and a copper foil pattern 15 formed by extending the first copper foil pattern 12 is formed parallel on the opposite side of the copper foil pattern 13 with the secondary side tuning coil L3 therebetween. One end of the copper foil pattern 14 is connected to a part of the ground GND (A2) extending in the direction perpendicular to the arrangement direction of the tuning coils L2 and L3. The other end of the copper foil pattern 14 is connected to one end of the copper foil pattern 13. That is, the copper foil patterns 13 and 14 are linearly formed parallel to the tuning coils L2 and L3 on one side of the opposing tuning coils L2 and L3. One end of the copper foil pattern 15 is connected to one end of the copper foil pattern 12, and the other end thereof is connected to the ground GND (B2). That is, the copper foil patterns 12 and 15 are linearly formed parallel to the tuning coils L2 and L3 on the other side of the opposing tuning coils L2 and L3.

As described above, the four copper foil patterns 12 to 15 are formed in the shape of an H. Accordingly, it is possible to optimize the coupling degree to make the frequency selection characteristic uniform among channels, similarly to the case of forming the two copper foil patterns 12 and 13 in the crank shape shown in FIG. 2B.

Figure 8:
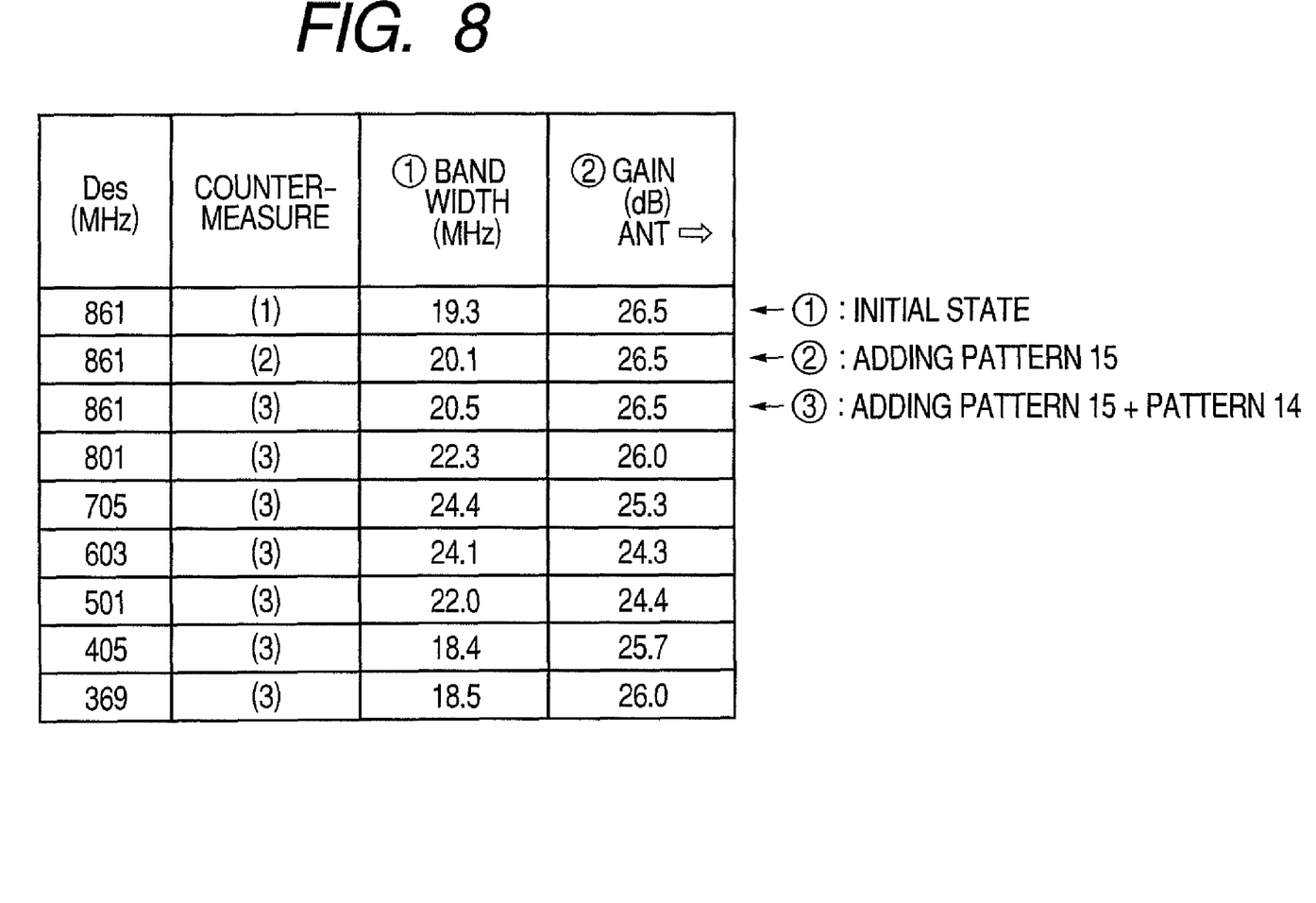
FIG. 8 is a diagram illustrating a performance test result of the double-tuned circuit according to the modified example.

FIG. 8 is a diagram illustrating a bandwidth characteristic and a gain characteristic of the double-tuned circuit according to the modified example. As shown in FIG. 8, as for the maximum reception frequency (861 MHz), in an initial state (1) where the copper foil patterns 14 and 15 are not added, in a case (2) where the copper foil pattern 14 is added, and in a case (3) where the copper foil pattern 14 and the copper foil pattern 15 are added, substantially equivalent band characteristics are secured although there is a slight difference of −3 dB in the bandwidth. As for the RF gain, there is no large difference, and equivalent characteristics are secured. As for the selection characteristic among channels and the gain characteristic in the state of applying the above-described countermeasure (3), it can be seen that there is no large difference.

The invention is not limited to the above-described embodiment, and may be applied even in the case of mounting the tuning coils L2 and L3 as the air-cored coils on the same surface as the chip mounting surface. In addition, a configuration of coupling the primary side and secondary side tuning air-cored coils can be applied in the same manner, even though the configuration is different from the configuration of the double-tuned circuit shown in FIG. 1.

The invention can be applied to an RF double-tuned circuit of a television tuner receiving a television broadcasting signal in a UHF band.

What is claimed is:

1. A double-tuned circuit comprising:

a primary side tuned circuit having a first air-cored coil;

a secondary side tuned circuit having a second air-cored coil;

wherein the first air-cored coil and the second air-cored coil are opposed to each other so that one opening end of the first air-cored coil and one opening end of the second air-cored coil are capable of being coupled to each other on a coil mounting surface;

wherein the coil mounting surface is provided with a first conductive pattern formed adjacent to the first air-cored coil in a direction perpendicular to an arrangement direction of the first and second air-cored coils, and both ends of first conductive pattern are connected to a ground;

wherein the coil mounting surface is provided with a second conductive pattern formed adjacent to the second air-cored coil in the direction perpendicular to the arrangement direction of the first and second air-cored coils, and both ends of the second conductive pattern are connected to the ground;

wherein the first conductive pattern extends from a first ground pattern formed close to the other opening end of the first air-cored coil to a side of the first air-cored coil on the coil mounting surface;

wherein the second conductive pattern extends from a second ground pattern formed close to the other opening end of the second air-cored coil to a side of the second air-cored coil on the coil mounting surface; and wherein the extending ends of the first and second conductive patterns are connected to one end of the first air-cored coil close to the ground through a third conductive pattern.

2. The double-tuned circuit according to claim 1, wherein the pattern width of at least one of the first conductive pattern and the second conductive pattern is adjusted according to the necessary coupling degree between the primary side tuned circuit and the secondary side tuned circuit.

3. The double-tuned circuit according to claim 1, wherein the other opening end of the second air-cored coil is connected to the second ground pattern to which a base end of the second conductive pattern extending to the side of the second air-cored coil is connected.

4. The double-tuned circuit according to claim 1, wherein the first conductive pattern extends to the side of the second air-cored coil, and the extending end thereof is connected to the second ground pattern.

5. The double-tuned circuit according to claim 1, wherein the second conductive pattern is formed in the direction perpendicular to the arrangement direction of the first and second air-cored coils on the opposite side of the first conductive pattern and extends to the side of the first air-cored coil, and the extending end thereof is connected to the first ground pattern.

* * * * *